(12) United States Patent
Park et al.

(10) Patent No.: US 9,510,443 B2
(45) Date of Patent: Nov. 29, 2016

(54) MULTILAYER CERAMIC ELECTRONIC COMPONENT AND BOARD HAVING THE SAME

(71) Applicant: SAMSUNG ELECTRO-MECHANICS CO., LTD., Suwon-Si, Gyeonggi-Do (KR)

(72) Inventors: Min Cheol Park, Suwon-Si (KR); Sang Soo Park, Suwon-Si (KR); Young Ghyu Ahn, Suwon-Si (KR); Kyo Kwang Lee, Suwon-Si (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/885,949

(22) Filed: Oct. 16, 2015

(65) Prior Publication Data
US 2016/0133383 A1  May 12, 2016

(30) Foreign Application Priority Data

Nov. 7, 2014  (KR) ........................ 10-2014-0154284

(51) Int. Cl.
| | |
|---|---|
| *H05K 1/03* | (2006.01) |
| *H01G 4/30* | (2006.01) |
| *H01G 4/012* | (2006.01) |
| *H01G 4/232* | (2006.01) |
| *H01G 4/12* | (2006.01) |
| *H05K 1/18* | (2006.01) |
| *H01G 2/06* | (2006.01) |
| *H05K 3/34* | (2006.01) |

(52) U.S. Cl.
CPC ............ *H05K 1/0306* (2013.01); *H01G 4/012* (2013.01); *H01G 4/232* (2013.01); *H01G 4/30* (2013.01); *H01G 2/065* (2013.01); *H01G 4/12* (2013.01); *H05K 1/181* (2013.01); *H05K 3/3442* (2013.01); *H05K 2201/10015* (2013.01)

(58) Field of Classification Search
CPC .......................... H05K 1/0306; H05K 1/111
See application file for complete search history.

(56) References Cited

U.S. PATENT DOCUMENTS

| 6,765,781 B2 | 7/2004 | Togashi |
| 2011/0013341 A1 | 1/2011 | Park et al. |

FOREIGN PATENT DOCUMENTS

| JP | 2012-033717 A | 2/2012 |
| KR | 10-2009-0117686 A | 11/2009 |
| KR | 10-2011-0007846 A | 1/2011 |

*Primary Examiner* — Jeremy C Norris
(74) *Attorney, Agent, or Firm* — McDermott Will & Emery LLP

(57) ABSTRACT

A multilayer ceramic electronic component includes a ceramic body including dielectric layers; and first and second internal electrodes having at least one of the dielectric layers interposed therebetween. Each of the first internal electrodes includes a first electrode plate and a first lead connected to the first electrode plate, the first lead being exposed to a first surface of the ceramic body and having a bent shape. Each of the second internal electrodes includes a second electrode plate and a second lead connected to the second electrode plate, the second lead being exposed to a second surface of the ceramic body and having a bent shape. A portion of the first lead overlaps the second electrode plate, and a portion of the second lead overlaps the first electrode plate.

12 Claims, 7 Drawing Sheets

MULTILAYER CERAMIC ELECTRONIC COMPONENT AND BOARD HAVING THE SAME

CROSS-REFERENCE TO RELATED APPLICATION

This application claims the benefit of priority to Korean Patent Application No. 10-2014-0154284, filed on Nov. 7, 2014 with the Korean Intellectual Property Office, the entirety of which is incorporated herein by reference.

BACKGROUND

The present disclosure relates to a multilayer ceramic electronic component and a board having the same.

Examples of electronic components using ceramic material include capacitors, inductors, piezoelectric elements, varistors, thermistors, and the like.

Among ceramic electronic components, a multilayer ceramic capacitor (MLCC) has a small size and a high capacitance and is easily mounted.

Such a multilayer ceramic capacitor is a chip-type capacitor that is mounted on circuit boards of various electronic products including display devices, such as liquid crystal displays (LCDs), plasma display panels (PDPs), and the like, computers, personal digital assistants (PDAs), mobile phones, and the like, and serves to store and discharge electrical energy.

The multilayer ceramic capacitor may serve to suppress voltage noise in a circuit. When the multilayer ceramic capacitor is used in a high-frequency environment, it is preferable that the equivalent series inductance (hereinafter referred to as "ESL") of the multilayer ceramic capacitor is low, and there is a need to secure a predetermined level or more of equivalent series resistance (hereinafter referred to as "ESR") to promote stability. However, as a conduction line becomes long, ESR and ESL tend to increase. Therefore, generally, when ESL is decreased, ESR is also decreased. Therefore, research into increasing ESR while keeping ESL low has been ongoing.

As described above, it may be possible to variously adjust the ESL and the ESR of the multilayer ceramic electronic component.

A multilayer capacitor for adjusting ESR and ESL is disclosed in the following Related Art Document.

SUMMARY

One aspect of the present disclosure may provide a multilayer ceramic electronic component having low equivalent series inductance (ESL) and high capacitance, and a board having the same.

According to one aspect of the present disclosure, a multilayer ceramic electronic component comprises a ceramic body including dielectric layers; and first and second internal electrodes having at least one of the dielectric layers interposed therebetween, wherein each of the first internal electrodes includes a first electrode plate and a first lead connected to the first electrode plate, the first lead being exposed to a first surface of the ceramic body and having a bent shape, each of the second internal electrodes includes a second electrode plate and a second lead connected to the second electrode plate, the second lead being exposed to a second surface of the ceramic body and having a bent shape, a portion of the first lead overlaps the second electrode plate, and a portion of the second lead overlaps the first electrode plate.

The first and second leads may be bent twice or more.

The first and second leads may be bent at an angle of 90 degrees.

Widths of the first and second leads may be less than widths of the first and second internal electrodes.

The first and second leads may be disposed within a width of the first and second electrode plates, respectively.

The multilayer ceramic electronic component of claim 1, wherein one side of the first and second leads is in parallel to one side of the first and second electrode plates, respectively, in a cross section of the ceramic body in a width-length direction.

The first and second leads may be exposed to opposite surfaces of the ceramic body.

The first and second electrode plates may overlap.

The first and second electrode plates may have a rectangular shape, and the first and second leads may be connected to ends of the first and second electrode plates in a length direction.

The first and second internal electrodes may be alternately exposed to opposite surfaces of the capacitor body.

The multilayer ceramic electronic component may further comprise first and second external electrodes disposed on outer surfaces of the ceramic body to be connected to exposed portions of the first and second leads, respectively.

According to another aspect of the present disclosure, a board having a multilayer ceramic electronic component comprises a printed circuit board; first and second board electrodes disposed on a surface of the printed circuit board; and the multilayer ceramic electronic component mounted on the printed circuit board and electrically connected to the first and second board electrodes, wherein the multilayer ceramic electronic component includes a ceramic body including dielectric layers, first and second internal electrodes disposed to face each other with at least one of the dielectric layers interposed therebetween, and first and second external electrodes connected to the first and second internal electrodes, respectively, each of the first internal electrodes includes a first electrode plate and a first lead connected to the first electrode plate, the first lead being exposed to a first surface of the ceramic body to thereby be connected to the first external electrode, and having a bent shape, each of the second internal electrodes includes a second electrode plate and a second lead connected to the second electrode plate, the second lead being exposed to a second surface of the ceramic body to thereby be connected to the second external electrode, and having a bent shape, a portion of the first lead overlaps the second electrode plate, and a portion of the second lead overlaps the first electrode plate.

BRIEF DESCRIPTION OF DRAWINGS

The above and other aspects, features and advantages of the present disclosure will be more clearly understood from the following detailed description taken in conjunction with the accompanying drawings.

DETAILED DESCRIPTION

Figure 1:
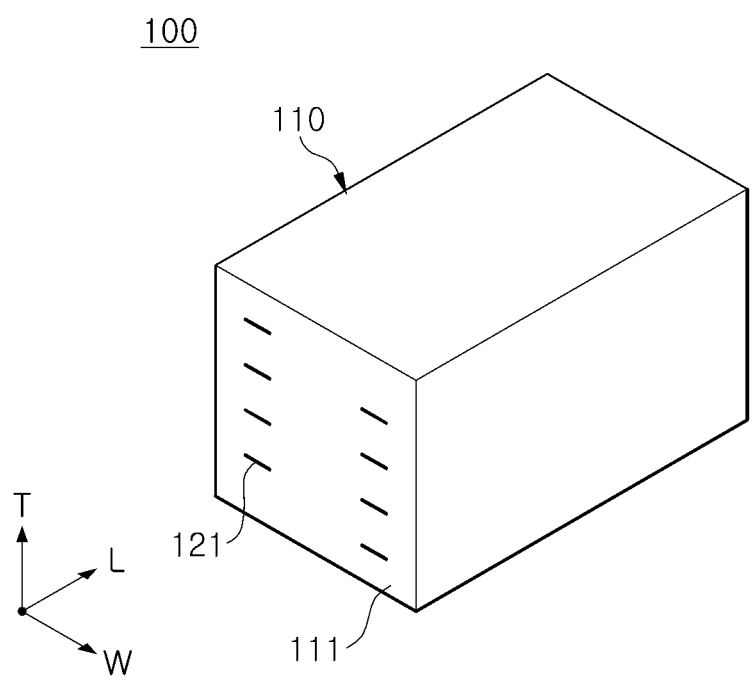
FIG. 1 is a perspective view of a multilayer ceramic electronic component according to an exemplary embodiment.

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the accompanying drawings, shapes and dimensions of components may be exaggerated for clarity. In addition, components having like functions will be denoted by like reference numerals throughout the accompanying drawings. Further, terms with respect to directions will be defined. As viewed in FIG. 1, "L" refers to a length direction, "W" refers to a width direction, and "T" refers to a thickness direction.

Multilayer Ceramic Electronic Component

Figure 2:
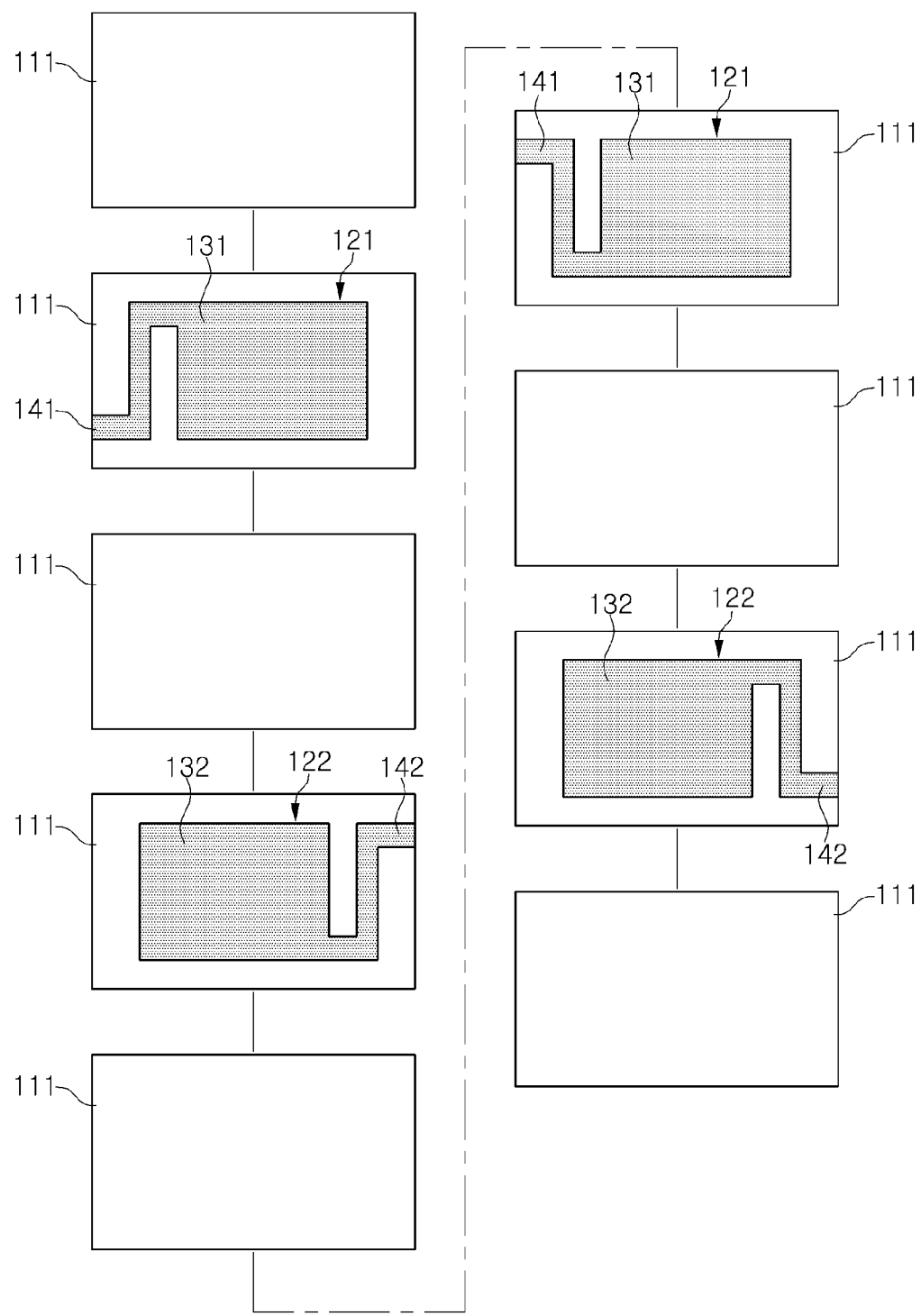
FIG. 2 is a plan view illustrating a relationship of dielectric layers and first and second internal electrodes stacked in the multilayer ceramic electronic component according to an exemplary embodiment.
Figure 3:
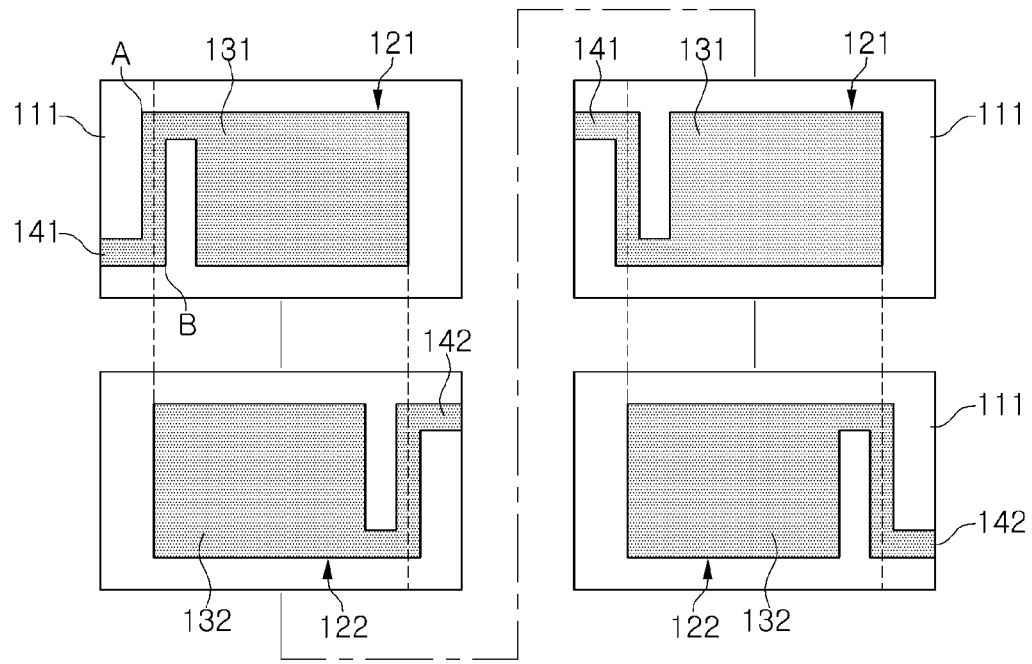
FIGS. 3 through 5 are plan views of dielectric layers provided with first and second internal electrodes which are stacked in the multilayer ceramic electronic component according to an exemplary embodiment.
Figure 4:
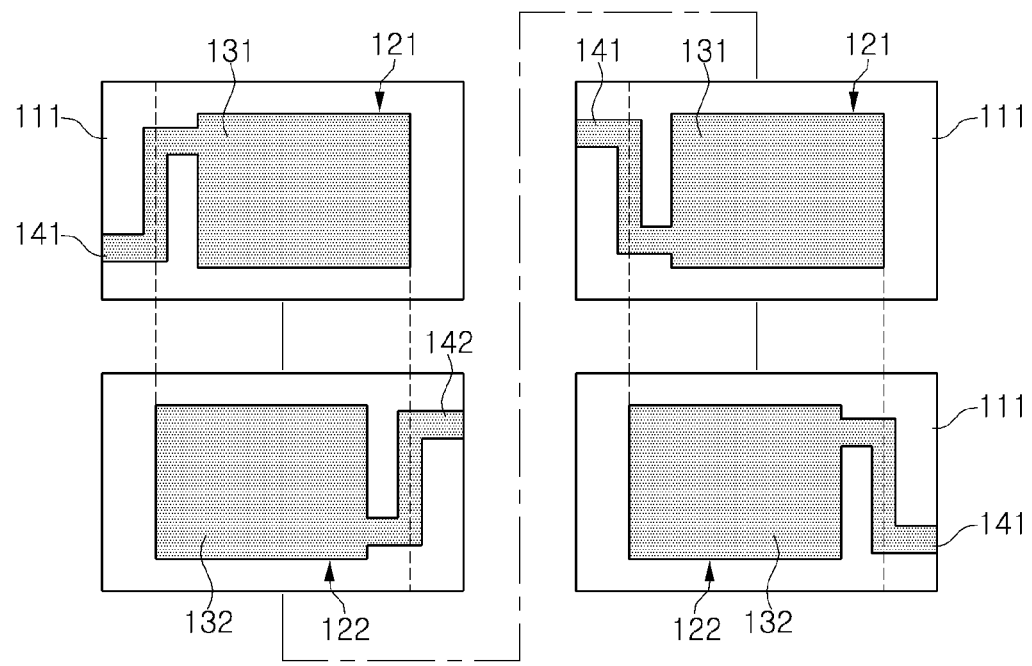
Figure 5:
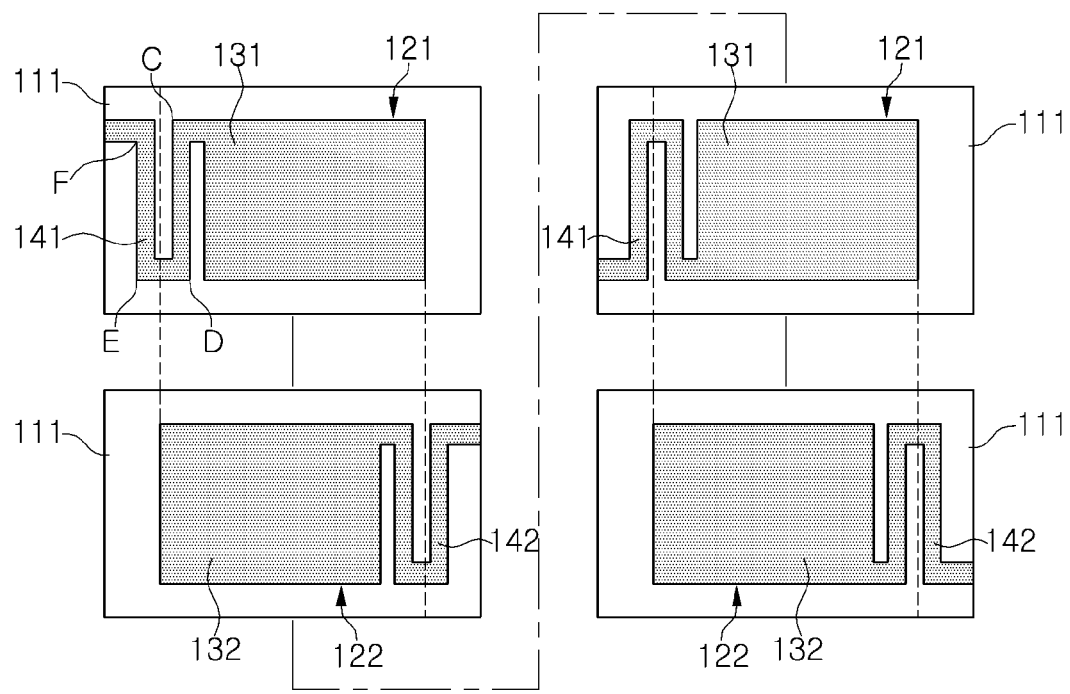

FIG. 1 is a perspective view of a multilayer ceramic electronic component 100 according to an exemplary embodiment; FIG. 2 is a plan view illustrating a relationship of dielectric layers and first and second internal electrodes stacked in the multilayer ceramic electronic component 100 according to an exemplary embodiment; and FIGS. 3 through 5 are plan views of dielectric layers 111 provided with first and second internal electrodes 121 and 122 which are stacked in the multilayer ceramic electronic component 100 according to an exemplary embodiment.

Referring to FIGS. 1 through 5, the multilayer ceramic electronic component 100 may include a ceramic body 110 including dielectric layers 111; and first and second internal electrodes 121 and 122 each having at least one of the dielectric layers 111 interposed therebetween, wherein each of the first internal electrodes 121 includes a first electrode plate 131 and a first lead 141 connected to the first electrode plate 131, exposed to one surface of the ceramic body 110, and having a bent shape, and each of the second internal electrodes 122 includes a second electrode plate 132 and a second lead 142 connected to the second electrode plate 132, exposed to one surface of the ceramic body 110, and having a bent shape. The first lead 141 overlaps the second electrode plate 132 and the second lead 142 overlaps the first electrode plate 131.

The ceramic body 110 illustrated in FIG. 1 may be formed by stacking a plurality of dielectric layers 111 in a thickness direction and then sintering the same. Adjacent dielectric layers 111 may be integrated with each other so that boundaries therebetween are not apparent. Here, the ceramic body 110 may have a hexahedral shape.

Referring to FIG. 2, in the multilayer ceramic electronic component 100, according to an exemplary embodiment, the dielectric layers 111 and the first and second internal electrodes 121 and 122 disposed on upper surfaces of the dielectric layers 111 may be stacked. The first and second internal electrodes 121 and 122 may be alternately provided with at least one of the dielectric layers 111 interposed therebetween, and may be disposed to be exposed to one side of the dielectric layers 111. The dielectric layers 111 and the first and second internal electrodes 121 and 122 that are stacked may be variously modified, and are not limited to those illustrated in FIG. 2.

The dielectric layer 111 may contain a high-k ceramic material, such as barium titanate ($BaTiO_3$) based ceramic powder. However, a material of the dielectric layers 111 is not limited thereto as long as sufficient capacitance may be obtained. In addition, the dielectric layers 111 may further contain a ceramic additive such as a transition metal oxide or carbide, rare earth elements, magnesium (Mg), aluminum (Al), an organic solvent, a plasticizer, a binder, and/or a dispersant, if necessary, in addition to the ceramic powder.

The first and second internal electrodes 121 and 122 having different polarities may be formed to be spaced apart from each other on ceramic sheets forming the dielectric layers 111.

The first and second internal electrodes 121 and 122 may be formed of a conductive material, such as silver (Ag), lead (Pd), platinum (Pt), nickel (Ni), and copper (Cu), or an alloy thereof. However, the material of the first and second internal electrodes 121 and 122 is not limited thereto.

The first and second internal electrodes 121 and 122 may include the first and second electrode plates 131 and 132 and the first and second leads 141 and 142, respectively. The first and second electrode plates 131 and 132 may be disposed to overlap each other with at least one of the dielectric layers 11 interposed therebetween. The first and second internal electrodes 121 and 122 may be electrically connected to first and second external electrodes 151 and 152 through the first and second leads 141 and 142, respectively, and different currents may be applied to the first and second internal electrodes 121 and 122 through the first and second external electrodes 151 and 152, respectively. Here, capacitance may be formed by the overlapping portions of the first and second electrode plates 131 and 132.

The multilayer ceramic electronic component 100, according to an exemplary embodiment, may include the first and second leads 141 and 142. Referring to FIG. 2, the first leads 141 may be exposed to the same end surface of the ceramic body 110, but may also be exposed to the same end surface of the ceramic body 110 in different positions when viewed in the width direction W of the ceramic body. FIG. 2 illustrates that two types of first leads 141 are exposed to the same end surface of the ceramic body 110 in different positions. However, the first leads 141 are not limited thereto, and may be exposed in various positions. Similarly, the second leads 142 are exposed in the same manner.

In the multilayer ceramic electronic component 100, if a multi-terminal structure is used in order to decrease equivalent series inductance (ESL), the number of leads may be increased, and thus equivalent series resistance (ESR) may also be decreased, and the stability of a power supply circuit may be deteriorated by the decreased ESR. In consideration of this problem, the first and second leads 141 and 142 included in the first and second internal electrodes 121 and 122 may be bent, and thus lengths of the first and second leads 141 and 142 may be increased, whereby a decrease in ESR may be significantly suppressed. In other words, the lengths and widths of the first and second leads 141 and 142 may be adjusted, and thus the ESR may be appropriately adjusted to a desired level. For example, the widths of the first and second leads 141 and 142 may be decreased to increase ESR. The first and second leads 141 and 142 may be formed to have a width of about 30 μm to 50 μm, which is stably realized by a screen printing process.

Referring to FIG. 3, since the widths of the first and second leads 141 and 142 are less than those of the first and second electrode plates 131 and 132, a decrease in ESR may be prevented. In addition, the first and second leads may include bent portions A and B. Since the bent portions increase the lengths of the first and second leads 141 and 142, they may prevent the decrease in ESR.

The bent portions may be variously modified to increase the lengths of the first and second leads 141 and 142. For example, as illustrated in FIG. 3, there may be two bent portions A and B. The first and second electrode plates 131 and 132 may have a rectangular shape, and the first and second leads 141 and 142 may have portions that are parallel to one side of the first and second electrode plates 131 and 132, respectively. Although not illustrated, the first and second leads 141 and 142 may have an "S" shape, in which they are inclined with respect to one side of the first and second electrode plates 131 and 132, or the like.

As illustrated in FIG. 3, the first and second leads 141 and 142 may extend from ends of the first and second electrode plates 131 and 132 in the length direction, respectively. In a cross section of the ceramic body in a width-length direction, the first and second leads 141 and 142 may be disposed in the same range as that of the widths of the first and second electrode plates, respectively. In addition, the first and second leads may be bent at an angle of 90 degrees. It is intended to prevent short circuits that may be generated in cases in which the first and second leads 141 and 142 are disposed outside the dielectric layers 111 and to make product design and product manufacturing processes convenient.

Referring to FIG. 4, in the cross section of the ceramic body in the width-length direction, the first and second leads 141 and 142 may be disposed within the range of the widths of the first and second electrode plates, respectively, thereby preventing short circuits that may be generated in cases in which the first and second leads 141 and 142 are disposed outside the dielectric layers 111.

The first and second leads 141 and 142 may be bent twice or more. FIG. 5 illustrates that the first and second leads 141 and 142 are bent four or more times, so that they include bent portions C, D, E, and F. As described above, the first and second leads 141 and 142 may be bent, and thus the lengths of the first and second leads 141 and 142 may be increased, whereby a decrease in ESR may be significantly suppressed.

Meanwhile, when the first and second leads 141 and 142 are disposed to overlap the second and first electrode plates 132 and 131, respectively, capacitance of the multilayer ceramic electronic component may be increased while ESL of the multilayer ceramic electronic component may be decreased. Since the first and second leads 141 and 142 are disposed as described above, the first and second leads 141 and 142 may contribute to forming capacitance and decreasing a current path of a frequency, and thus electrical characteristics such as ESL may be improved. Since a current flowing through the first and second internal electrodes 121 and 122 may flow through the overlapping portions in which the first and second leads 141 and 142 and the first and second electrode plates 131 and 132 overlap each other under a predetermined condition, a current path may be short, and thus low ESL may be maintained.

As illustrated in FIG. 3, the first and second leads 141 and 142 may extend from the first and second electrode plates 131 and 132, respectively, and be bent to have first bent portions A, and then they may extend to have sides parallel to the sides of the first and second electrode plates 131 and 132 in the width direction. Then, the first and second leads 141 and 142 may be bent to have second bent portions B in the range of the widths of the first and second electrode plates 131 and 132. The first and second leads 141 and 142 may overlap the second and first electrode plates 132 and 131, respectively, but the overlapping portions may be limited to portions of the first and second leads 141 and 142 that are positioned before the first bent portions A and are parallel to the sides of the first and second electrode plates 131 and 132 in the length direction (see FIGS. 7 and 8). Alternatively, the overlapping portions may include portions of the first and second leads 141 and 142 that are positioned between the first bent portions A and the second bent portions B and are parallel to the sides of the first and second electrode plates 131 and 132 in width direction (see FIGS. 3 and 9).

Table 1 includes data illustrating changes in ESL and capacitance depending on an area of the overlapping portions of the first and second leads 141 and 142 and the second and first electrode plates 132 and 131.

In the Comparative Example and Inventive Examples 1 to 3 of Table 1, multilayer ceramic electronic components were manufactured to have a size of 1.0 mm×0.5 mm, and widths of first and second leads were 50 μm. ESL was indicated by an average value of ESL from a self resonance frequency (SRF) to 3 GHz, and capacitance was indicated by an average value of capacitances from 30 kHz to the self resonance frequency (SRF).

Figure 6:
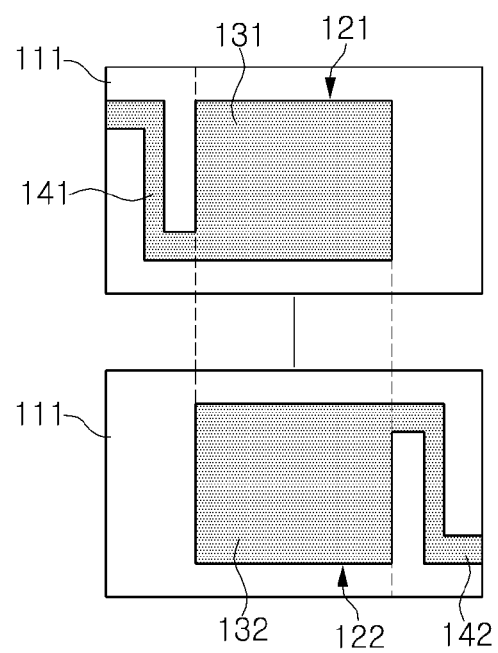
FIG. 6 is a plan view of dielectric layers provided with first and second internal electrodes which are stacked in a multilayer ceramic electronic component according to Comparative Example.
Figure 7:
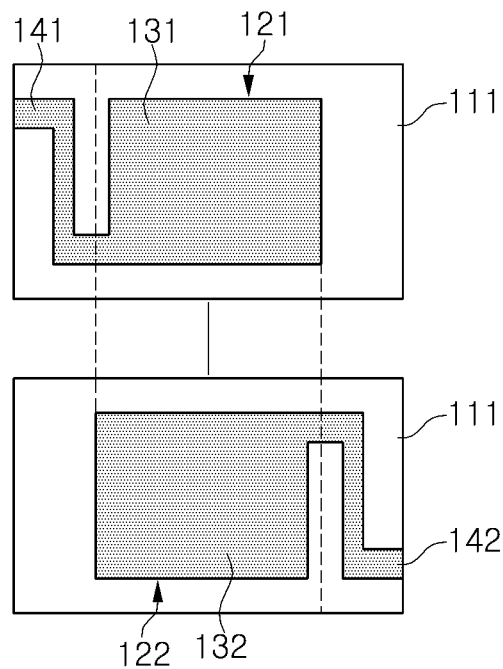
FIGS. 7 through 9 are plan views of dielectric layers provided with first and second internal electrodes which are stacked in multilayer ceramic electronic components according to Inventive Examples.
Figure 8:
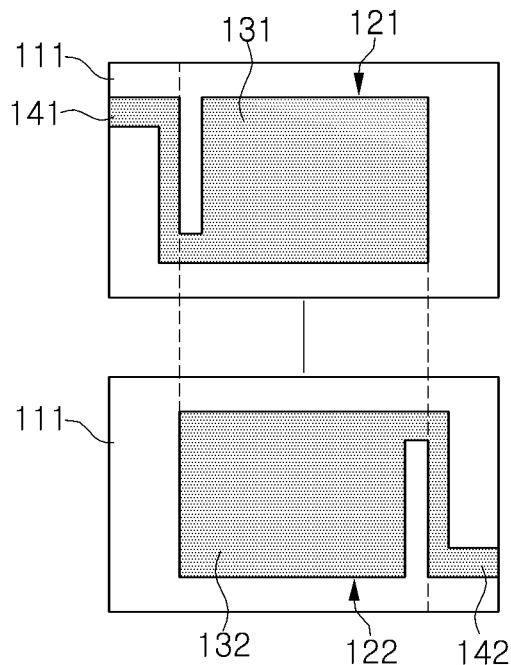
Figure 9:
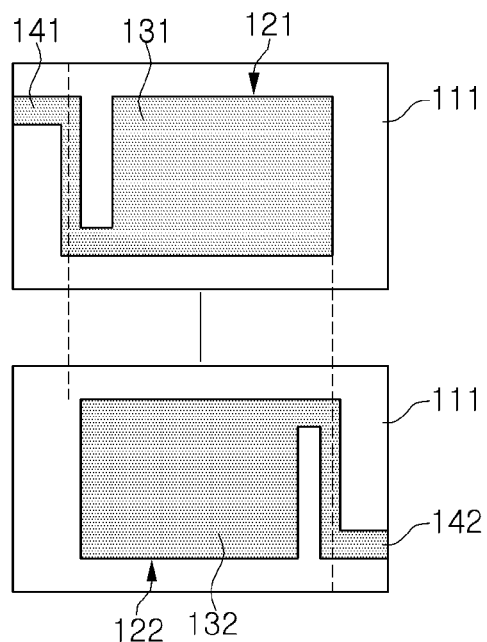

FIGS. 6 through 9 illustrate the Comparative Example and Inventive Examples 1 to 3. FIG. 6 illustrates an overlapping region between first and second leads and second and first electrode plates of a multilayer ceramic electronic component, according to the Comparative Example. In the multilayer ceramic electronic component 100, according to the Comparative Example, the first and second leads do not overlap the second and first electrode plates. FIGS. 7 through 9 illustrate overlapping regions between the first and second leads 141 and 142 and the second and first electrode plates 132 and 131 of the multilayer ceramic electronic components 100 according to Inventive Examples 1 to 3, respectively. Referring to FIGS. 7 through 9, Inventive Example 1 had the smallest overlapping region, and Inventive Example 3 had the largest overlapping region.

TABLE 1

| Comparative Example and Inventive Example No. | ESL (pH) | Capacitance (nF) |
| --- | --- | --- |
| Comparative Example | 202 | 44 |
| Inventive Example 1 | 193 | 46 |
| Inventive Example 2 | 184 | 48 |
| Inventive Example 3 | 153 | 53 |

Referring to Table 1, in the Comparative Example having no overlapping region between the first and second leads and the second and first electrode plates, ESL was 202 pH, which was the largest value, and capacitance was 44 nF, which was the smallest value.

In all of Inventive Examples 1 to 3, ESL was less than 200 pH, and capacitance exceeded 45 nF. In addition, it may be appreciated that as the overlapping regions are increased, measured ESL was lower and measured capacitance increased. As a result, the overlapping regions between the first and second leads 141 and 142 and the second and first electrode plates 132 and 131 may be adjusted to adjust ESL and capacitance.

Figure 10:
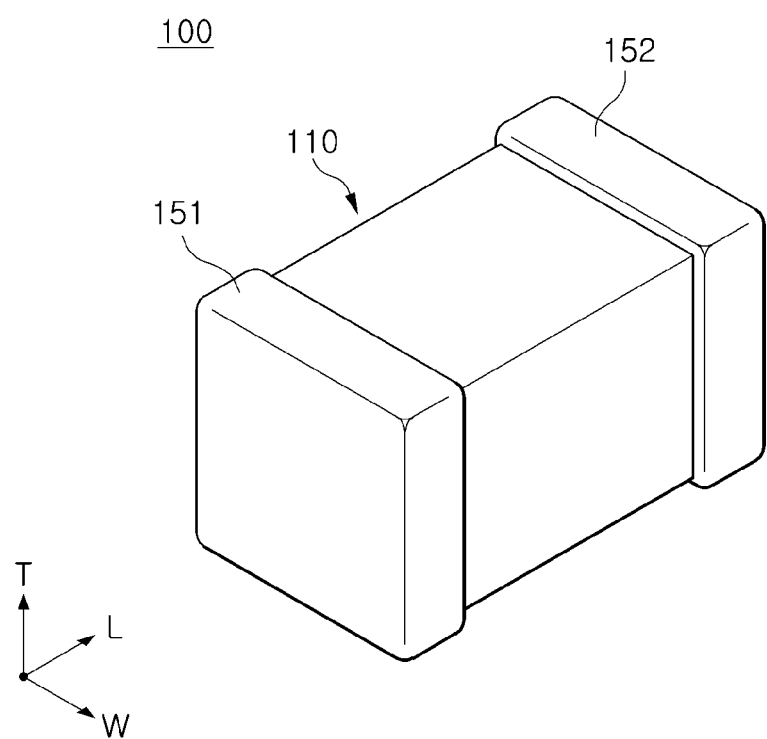
FIG. 10 is a perspective view of a multilayer ceramic electronic component according to another exemplary embodiment.

FIG. 10 is a perspective view of a multilayer ceramic electronic component 100 according to another exemplary embodiment. Referring to FIG. 10, the multilayer ceramic electronic component 100, according to this exemplary embodiment, may further include first and second external electrodes 151 and 152 disposed on outer surfaces of the ceramic body 110 to be connected to exposed portions of the first and second leads 141 and 142, respectively. The first and second external electrodes 151 and 152 may be connected to the first and second leads 141 and 142, respectively, to thereby be electrically connected to the first and second internal electrodes 121 and 122, respectively.

The first and second external electrodes 151 and 152 may be formed to cover both end surfaces of the ceramic body 110 in the length direction and be electrically connected to the first and second leads 141 and 142 exposed through both end surfaces of the ceramic body 110 in the length direction, respectively.

The first and second external electrodes 151 and 152 may be formed of a conductive material, such as silver (Ag), lead (Pb), platinum (Pt), nickel (Ni), and copper (Cu) or an alloy thereof. However, the material of the first and second external electrodes 151 and 152 is not limited thereto.

Meanwhile, first and second plating layers (not illustrated) may be formed on the first and second external electrodes 151 and 152.

The first and second plating layers may include nickel (Ni) plating layers formed on the first and second external electrodes 151 to 152 and tin (Sn) plating layers formed on the nickel plating layers.

The first and second plating layers may increase bonding strength between the multilayer ceramic electronic component 100 and a printed circuit board when the multilayer ceramic electronic component 100 is mounted on the printed circuit board, or the like, using solders. Here, a plating operation for forming the first and second plating layers may be performed by a known method. As an example, lead-free plating may be performed in order to be environmentally friendly. However, the plating operation is not limited thereto.

In the present disclosure, the numbers and positions of first and second leads are not limited to those illustrated in FIGS. 2 through 5 and 10, and may be variously modified. In addition, the numbers and positions of first and second external electrodes 151 and 152 may be variously modified.

Board Having Multilayer Ceramic Electronic Component

Figure 11:
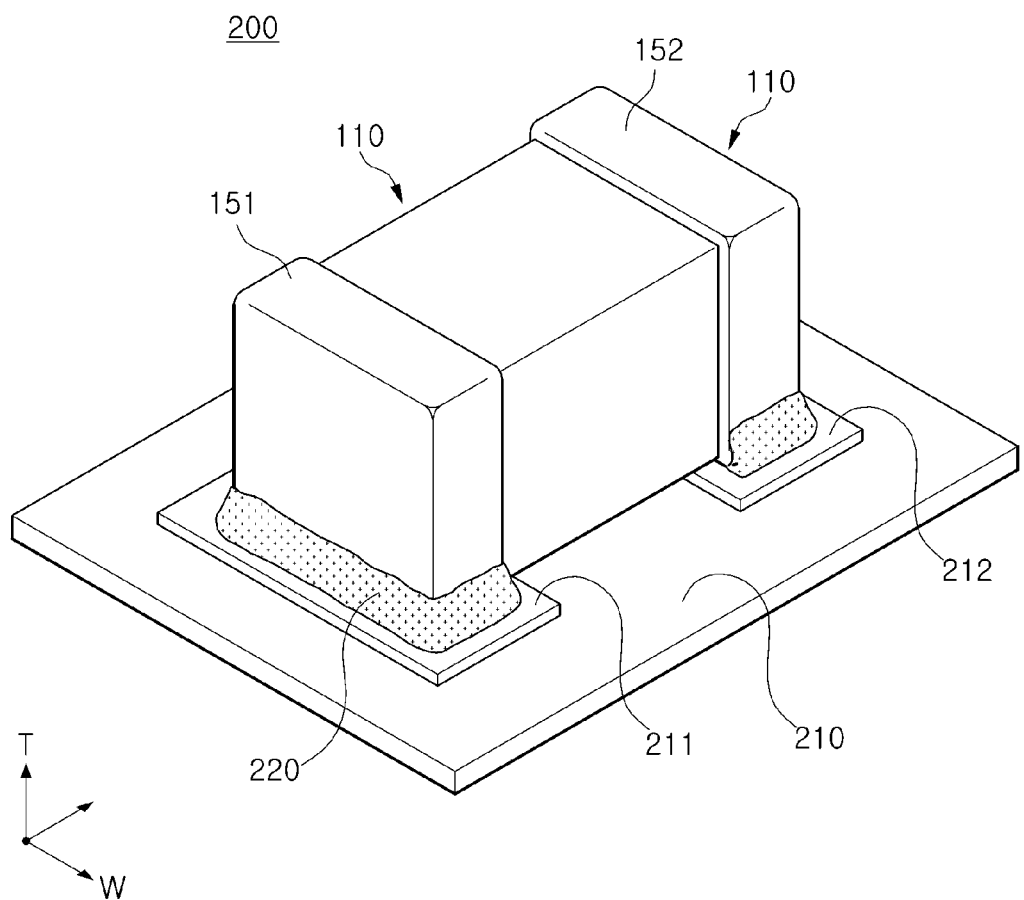
FIG. 11 is a perspective view of a board having a multilayer ceramic electronic component according to an exemplary embodiment.

FIG. 11 is a perspective view of a board 200 having a multilayer ceramic electronic component 100 according to an exemplary embodiment.

Referring to FIG. 11, the board 200 having a multilayer ceramic electronic component 100 may include a printed circuit board 210, first and second board electrodes 211 and 212 disposed on one surface of the printed circuit board 210, and the multilayer ceramic electronic component 100 mounted on the printed circuit board 210 and electrically connected to the first and second board electrodes 211 and 212. The multilayer ceramic electronic component 100 may include a ceramic body 110 including dielectric layers 111; first and second internal electrodes 121 and 122 provided with at least one of the dielectric layers 111 interposed therebetween; and first and second external electrodes 151 and 152 connected to the first and second internal electrodes 121 and 122, respectively, wherein each of the first internal electrodes 121 includes a first electrode plate 131 and a first lead 141 connected to the first electrode plate 131, exposed to one surface of the ceramic body 110 to thereby be connected to the first external electrode 151, and having a bent shape, and each of the second internal electrodes 122 includes a second electrode plate 132 and a second lead 142 connected to the second electrode plate 132, exposed to one surface of the ceramic body 110 to thereby be connected to the second external electrode 152, and having a bent shape. The first lead 141 overlaps the second electrode plate 132, and the second lead 142 overlaps the first electrode plate 131.

The first and second external electrodes 151 and 152 may be bonded to the first and second board electrodes 211 and 212 of the printed circuit board 210 through solders 220, respectively.

The multilayer ceramic electronic component 100 according to this exemplary embodiment may be the same as the multilayer ceramic electronic component 100 according to the previous exemplary embodiment.

As set forth above, according to exemplary embodiments in the present disclosure, a multilayer ceramic electronic component having low equivalent series inductance (ESL) and high capacitance, and a board having the same, may be provided.

While exemplary embodiments have been shown and described above, it will be apparent to those skilled in the art that modifications and variations could be made without departing from the scope of the present inventive concept as defined by the appended claims.

What is claimed is:

1. A multilayer ceramic electronic component comprising: a ceramic body including dielectric layers; and
first and second internal electrodes having at least one of the dielectric layers interposed therebetween,
wherein each of the first internal electrodes includes a first electrode plate and a first lead connected to the first electrode plate, the first lead being exposed to a first surface of the ceramic body and having a bent shape,
each of the second internal electrodes includes a second electrode plate and a second lead connected to the second electrode plate, the second lead being exposed to a second surface of the ceramic body and having a bent shape,
a portion of the first lead overlaps the second electrode plate, and
a portion of the second lead overlaps the first electrode plate.

2. The multilayer ceramic electronic component of claim 1, wherein the first and second leads are bent twice or more.

3. The multilayer ceramic electronic component of claim 1, wherein the first and second leads are bent at an angle of 90 degrees.

4. The multilayer ceramic electronic component of claim 1, wherein widths of the first and second leads are less than widths of the first and second internal electrodes.

5. The multilayer ceramic electronic component of claim 1, wherein the first and second leads are disposed within a width of the first and second electrode plates, respectively.

6. The multilayer ceramic electronic component of claim 1, wherein one side of the first and second leads is in parallel to one side of the first and second electrode plates, respectively, in a cross section of the ceramic body in a width-length direction.

7. The multilayer ceramic electronic component of claim 1, wherein the first and second leads are exposed to opposite surfaces of the ceramic body.

8. The multilayer ceramic electronic component of claim 1, wherein the first and second electrode plates overlap.

9. The multilayer ceramic electronic component of claim 1, wherein the first and second electrode plates have a rectangular shape, and
the first and second leads are connected to ends of the first and second electrode plates in a length direction.

10. The multilayer ceramic electronic component of claim 1, wherein the first and second internal electrodes are alternately exposed to opposite surfaces of the capacitor body.

11. The multilayer ceramic electronic component of claim 1, further comprising first and second external electrodes disposed on outer surfaces of the ceramic body to be connected to exposed portions of the first and second leads, respectively.

12. A board having a multilayer ceramic electronic component, the board comprising:
a printed circuit board;
first and second board electrodes disposed on a surface of the printed circuit board; and
the multilayer ceramic electronic component mounted on the printed circuit board and electrically connected to the first and second board electrodes,
wherein the multilayer ceramic electronic component includes a ceramic body including dielectric layers, first and second internal electrodes disposed to face each other with at least one of the dielectric layers interposed therebetween, and first and second external electrodes connected to the first and second internal electrodes, respectively,
each of the first internal electrodes includes a first electrode plate and a first lead connected to the first electrode plate, the first lead being exposed to a first surface of the ceramic body to thereby be connected to the first external electrode, and having a bent shape,
each of the second internal electrodes includes a second electrode plate and a second lead connected to the second electrode plate, the second lead being exposed to a second surface of the ceramic body to thereby be connected to the second external electrode, and having a bent shape,
a portion of the first lead overlaps the second electrode plate, and
a portion of the second lead overlaps the first electrode plate.

* * * * *